(12) United States Patent
Chan et al.

(10) Patent No.: US 10,790,382 B2
(45) Date of Patent: Sep. 29, 2020

(54) METHOD FOR FORMING HORIZONTAL NANOWIRES AND DEVICES MANUFACTURED THEREOF

(71) Applicant: IMEC VZW, Leuven (BE)

(72) Inventors: Boon Teik Chan, Leuven (BE); Silvia Armini, Heverlee (BE); Elisabeth Camerotto, Schaerbeek (BE); Zheng Tao, Heverlee (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 15/845,300

(22) Filed: Dec. 18, 2017

(65) Prior Publication Data

US 2018/0182868 A1   Jun. 28, 2018

(30) Foreign Application Priority Data

Dec. 23, 2016 (EP) ..................................... 16206805
Jan. 23, 2017 (EP) ..................................... 17152581

(51) Int. Cl.
*H01L 29/66* (2006.01)
*H01L 29/775* (2006.01)
(Continued)

(52) U.S. Cl.
CPC ........ *H01L 29/66818* (2013.01); *B82Y 10/00* (2013.01); *H01L 29/0673* (2013.01);
(Continued)

(58) Field of Classification Search
CPC ............. H01L 29/66818; H01L 29/775; H01L 29/66469; H01L 29/1079; H01L 29/78696;
(Continued)

(56) References Cited

U.S. PATENT DOCUMENTS

| 9,425,293 B1* | 8/2016 | Balakrishnan ...... H01L 29/0673 |
| 2011/0133061 A1* | 6/2011 | Yu ..................... H01L 27/14649 |
| | | 250/214.1 |

(Continued)

FOREIGN PATENT DOCUMENTS

| CN | 104253048 A | 12/2014 |
| WO | 2015/094301 A1 | 6/2015 |

OTHER PUBLICATIONS

European Search Report, European Patent Application No. 16206805.0, dated Jul. 14, 2017, 12 pages.

*Primary Examiner* — Benjamin Tzu-Hung Liu
(74) *Attorney, Agent, or Firm* — McDonnell Boehnen Hulbert & Berghoff LLP

(57) ABSTRACT

A method for forming horizontal nanowires, the method comprising providing a substrate comprising a dielectric layer and a fin structure comprising a portion protruding from the dielectric layer, the protruding portion being partially un-masked and comprising a multi-layer stack consisting of a layer of a first material stacked alternately and repeatedly with a layer of a second material and forming horizontal nanowires done by performing a cycle comprising removing selectively the first material up to the moment that a horizontal nanowire of the second material becomes suspended over a remaining portion of the partially un-masked protruding portion, forming a sacrificial layer on the remaining portion, while leaving the suspended horizontal nanowire uncovered, providing, selectively, a cladding layer on the suspended horizontal nanowire, and thereafter removing the sacrificial layer. The horizontal nanowires become suspended starting from the top and the cladding layer is removed, after the bottom horizontal nanowire becomes suspended.

21 Claims, 10 Drawing Sheets

(51) Int. Cl.
*H01L 29/10* (2006.01)
*H01L 29/786* (2006.01)
*H01L 29/423* (2006.01)
*H01L 29/06* (2006.01)
*H01L 29/78* (2006.01)
*B82Y 10/00* (2011.01)

(52) U.S. Cl.
CPC .... *H01L 29/1079* (2013.01); *H01L 29/42392* (2013.01); *H01L 29/66439* (2013.01); *H01L 29/66469* (2013.01); *H01L 29/775* (2013.01); *H01L 29/785* (2013.01); *H01L 29/78696* (2013.01)

(58) Field of Classification Search
CPC ......... H01L 29/66439; H01L 29/42392; H01L 29/0673; H01L 29/785; H01L 29/66795; B82Y 10/00; B82Y 30/00; B82Y 40/00
See application file for complete search history.

(56) References Cited

U.S. PATENT DOCUMENTS

| | | |
|---|---|---|
| 2013/0075797 A1 | 3/2013 | Okano |
| 2013/0161756 A1 | 6/2013 | Glass et al. |
| 2014/0097502 A1* | 4/2014 | Sun .................... H01L 29/0673 257/392 |
| 2014/0273423 A1 | 9/2014 | Fronheiser et al. |
| 2015/0243509 A1* | 8/2015 | Chan ................. H01L 21/31116 257/506 |
| 2017/0194357 A1 | 7/2017 | Balakrishnan et al. |
| 2018/0096899 A1* | 4/2018 | Beasor ............ H01L 21/823821 |

* cited by examiner

METHOD FOR FORMING HORIZONTAL NANOWIRES AND DEVICES MANUFACTURED THEREOF

CROSS-REFERENCE TO RELATED APPLICATIONS

The present application is a non-provisional patent application claiming priority to European Patent Application No. 16206805.0, filed Dec. 23, 2016, and European Patent Application No. 17152581.9, filed Jan. 23, 2017, the contents of both which are hereby incorporated by reference.

FIELD OF THE DISCLOSURE

The present disclosure is related to the field of semiconductor devices. More specifically, it is related to a method for forming horizontal nanowires and devices manufactured thereof.

BACKGROUND

In the past decade, the semiconductor industry has changed the design of transistors by moving from planar CMOS to fin-type field effect transistors (Fin-FETs). However, as the fin width has continued to decrease in an effort to enable ultimate CMOS scaling, undesirable variability and mobility in the channel have become a challenge due to the result of decreasing channel width. One way to overcome this problem has been the introduction of a new transistor architecture called the gate-all-around field effect transistor (GAA-FET). In a GAA-FET design, the gate is disposed so as to completely wrap the channel. The GAA-FET design also incorporates at least one horizontal nanowire, whereby the nanowires forming the channels are suspended as they connect from the source to the drain. This provides better gate control and electrostatics than finFETs, thereby enabling further gate length scaling.

Despite these advantages, there are requirements as well as challenges associated with the making of horizontal nanowires. The ultimate goal for GAA-FET is to have at least three nanowires in parallel in order to increase driving current, to keep the critical dimension (CD) scaling within 5 to 7 nm, and to provide same width across all the nanowires for better performance. The challenges thus lie in the making of the nanowires to satisfy these requirements.

Horizontal nanowires are typically made by removing a sacrificial semiconductor material selectively from a multi-layer stack containing alternating layers of this sacrificial material and a semiconductor nanowire material. Selective removal can be done by using selective wet etching. US 2013/0161756 A1 discloses selectively etching the sacrificial SiGe layers with a wet etch that selectively removes the SiGe but does not remove the silicon nanowire structures. Selective removal can also be done by using selective dry plasma etching, whereby selective oxidation may be done a priori.

Although these techniques can help in the forming of horizontal nanowires, they do not guarantee satisfying the requirement of CD being scaled to 5 to 7 nm and/or providing the same CD across all the nanowires formed. Thus, although selective removal would lead to the formation of nanowires, it may not satisfy the above requirements. Furthermore, the selectivity between the alternating layers of the semiconductor material to be sacrificed and the semiconductor material to be made into nanowires will suffer from non-uniformities between incoming wafers having such multi-layer stacks. The selective etch process, while producing nanowires, may not be able to meet the above requirements.

There is, therefore, a need for methods that enable the formation of horizontal nanowires that are suitable for manufacturing GAA-FETs without jeopardizing device performance while keeping up with the scaling efforts of CMOS manufacturing.

SUMMARY

It is an object of the present disclosure to provide efficient and simple methods to form horizontal nanowires. It is a further object of the disclosure to form a gate-all-around field effect transistor (GAA-FET).

The above objective can be accomplished by a method according to the present disclosure.

In a first aspect, the present disclosure relates to a method for forming horizontal nanowires. The method involves providing a substrate and forming horizontal nanowires. The substrate includes a dielectric layer and a fin structure. The fin structure includes a portion protruding from the dielectric layer. The protruding portion is partially un-masked and includes a multi-layer stack that includes a layer of a first material stacked alternately and repeatedly with a layer of a second material. The forming is done by performing a cycle. The cycle involves removing selectively the first material up to the moment that a horizontal nanowire of the second material becomes suspended over a remaining portion of the partially un-masked protruding portion. A sacrificial layer is formed on the remaining portion, while leaving the suspended horizontal nanowire uncovered. A cladding layer is provided on the suspended horizontal nanowire and thereafter the sacrificial layer is removed. The horizontal nanowires formed in the cycle become suspended starting from the top and the cladding layer is removed after the bottom horizontal nanowire becomes suspended.

In some embodiments, the method can allow for formation of horizontal nanowires, particularly more than two horizontal nanowires in a sequential way, thereby making the formation of such nanowires independent of the limitations of selective etching of the first material with respect to the second material.

The inventors have found out that forming a sacrificial layer on the remaining portion that follows the selective removal of the first material up to the moment that a horizontal nanowire becomes suspended and the provision of a cladding layer, selectively, on the suspended horizontal nanowire can allow for sequential formation of horizontal nanowires.

The method can also allow for forming more than two horizontal nanowires.

The provision of the cladding layer helps to avoid any further change in the size of the already formed horizontal nanowire during the formation of the subsequent horizontal nanowires.

Thus, the method can further allow for optimizing and further preserving the (desired) diameter (also referred to as the "critical dimension" (CD)) of the horizontal nanowires during their formation.

Thus, the method can allow for forming horizontal nanowires, particularly more than two horizontal nanowires, having the substantially the same (desired) diameter.

The method can also allow for formation of horizontal nanowires starting from a fin structure, where the height and the profile of the fin becomes less of a challenge for obtaining horizontal nanowires, particularly more than two horizontal nanowires having substantially the same (desired) diameter.

Additionally, the method can be compatible with CMOS manufacturing.

In embodiments, the substrate can be rotated during the formation of the sacrificial layer. This rotation can be performed along a vertical axis perpendicular to the substrate.

By rotating the substrate, the sacrificial layer can be homogeneously distributed over the surface. Furthermore, rotation can allow for controlling the thickness of the sacrificial layer by adjusting the rotation speed. Homogeneously distributed sacrificial layer with a controlled thickness allows for uniform coverage of the remaining portion. Uniform coverage of the remaining portion allows for the provision of the cladding layer over the complete surface of the suspended horizontal nanowire.

In embodiments, the sacrificial layer can be a spin-on material and can be self-planarizing.

A spin-on material that is self-planarizing can allow for uniform coverage of the remaining portion without creation of topography. Absence of topography has the advantage that material removal processes, such as etch back, in order to provide the required thickness may be avoided. Avoiding the use of material removal processes allows for preventing the modification of the (desired) diameter of the already formed horizontal nanowire by being subjected chemicals during the etch-process.

In embodiments, the sacrificial layer may be formed as a spin-on carbon layer (SoC).

Forming the sacrificial layer as a SoC layer can allow easy removal without damaging the masked part of the protruding portion. The mask of the masked part of the protruding portion may include an interlayer dielectric in contact with a dielectric spacer material. The damaging of the interlayer dielectric and the dielectric spacer material may result in degradation of the device performance since it can result in exposure of the gate electrode, which can lead to electrical shorting of the gate electrode with the source or the drain region after establishing the electrical contact.

In embodiments, the selective removal of the first material may be cyclic and may involve oxidizing the first material and the second material and performing an etching process. Parameters of the etching process may be chosen to remove the oxide of the first material faster than the oxide of the second material.

Such a cyclic selective removal can allow for removal of the first material with respect to the second material with improved selectivity.

In embodiments, the etching process may be a dry plasma etching process.

In embodiments, the cladding layer may be a metal.

Having a metal cladding can allow for protection of the horizontal nanowire over which it is provided during the removal of the sacrificial layer. This can ensure the preservation of the size of the horizontal nanowire.

In embodiments, this metal may be nickel, cobalt or ruthenium.

In embodiments, this metal may be nickel.

In alternative embodiments, this cladding layer may be a metal oxide.

This metal oxide may be a high-k dielectric material. This high-k dielectric material may be aluminum oxide, hafnium oxide, zinc oxide, zirconium oxide or titanium oxide.

A metal oxide cladding layer has the advantage that it may not be affected by the cyclic selective removal.

In embodiments, the selective provision of the cladding layer may involve performing an electro-less deposition or an atomic layer deposition.

By performing the electro-less or atomic layer deposition, the thickness of the cladding layer may be better controlled. Better control of the thickness of the cladding layer may result in preservation of the size of the horizontal nanowire during the removal of the sacrificial layer.

Furthermore, electro-less deposition is advantageous due to the fact that it is a low-temperature process such that it can be carried out at a temperature in the range of room temperature to 90° C. and preferably, in the range of room temperature to 70° C. Furthermore, it can provide selective deposition.

In embodiments, the first material may include Si and Ge and the second material may include Si.

In embodiments, the first material may be SiGe and the second material may be Si.

In embodiments, the first material may be SiGe and the second material may be Ge.

In embodiments, the first material may include Si and the second material may include Si and Ge.

In embodiments, the first material may be Si and the second material may be SiGe.

In embodiments, the selective removal may involve performing a wet etching process.

In embodiments, the wet etching process may be performed by using a wet etchant including hydrogen chloride.

In embodiments, the wet etchant may include water and hydrogen chloride.

In embodiments, where the selective removal may involve performing this wet etching process, a layer of a first material including a binary Group III-V material may be stacked alternately and repeatedly with a layer of a second material including a ternary Group III-V material, thus making the multi-layer stack.

In embodiments, the binary Group III-V material may be InP.

In embodiments, the ternary Group III-V material may be InGaAs or GaAsSb.

In embodiments, the first material and/or the second material may be doped with a dopant element.

In embodiments, the dopant element may be an n-type or a p-type dopant element.

In embodiments, the present disclosure relates to a method for fabricating a horizontal gate-all-around nanowire field effect transistor that involves forming suspended horizontal nanowires according to embodiments of the first aspect of the present disclosure. A gate stack may be provided surrounding the suspended horizontal nanowires. This gate stack may include a gate insulator and a gate metal provided on the gate insulator.

The method can allow for forming plurality of horizontal nanowires, particularly more than 2 nanowires having substantially the same diameter, scalable, down to 5 to 7 nm. Thus, it can allow for meeting the requirements for achieving the desired device performance.

In a second aspect, the present disclosure relates to a semiconductor structure. The semiconductor structure includes a substrate that includes a dielectric layer and a fin structure. This fin structure includes a portion protruding from the dielectric layer. This protruding portion is partially un-masked thereby including a multi-layer stack that includes a layer of a first material stacked alternately and repeatedly with a layer of a second material. The partially un-masked protruding portion further includes horizontal nanowires of the second material suspended over a sacrificial layer and at least one of the horizontal nanowires is covered with a cladding layer. This sacrificial layer covers the multi-layer stack, where the layers have a non-uniform size.

Thus, there is provided a semiconductor structure enabling sequential formation of horizontal nanowires. This semiconductor structure is suitable for the manufacture of horizontal gate-all-around nanowire field effect transistors (GAA-FET) comprising plurality of horizontal nanowires (e.g., more than 2 nanowires).

In embodiments, the sacrificial layer may be formed as a spin-on-carbon layer.

In embodiments, the diameter of the horizontal nanowires may be substantially the same.

Thus, there is provided a structure enabling the manufacture of horizontal gate-all-around nanowire field effect transistors (GAA-FET) with improved device performance due to the to the plurality of horizontal nanowires having substantially the same diameter.

In embodiments, the diameter of the horizontal nanowires may have a standard deviation of 2 nm.

In embodiments, the cladding layer may be a metal.

The metal cladding layer can increase the resistance to the chemical attack during the selective removal of the first layer, thus maintaining the diameter of the nanowire.

In embodiments, this metal may be nickel, cobalt or ruthenium.

In other embodiments, this metal is nickel.

In alternative embodiments, the cladding layer may be a metal oxide. In embodiments, this metal oxide may be a high-k dielectric material. In embodiments, this high-k dielectric material may be aluminum oxide, hafnium oxide, zinc oxide, zirconium oxide or titanium oxide.

In embodiments, the first material may include Si and Ge and the second material may comprise Si.

In embodiments, the first material may include SiGe and the second material may comprise Si.

In embodiments, the first material may include SiGe and the second material may include Ge.

In embodiments, the first material may include Si and the second material may include Si and Ge.

In embodiments, the first material may include Si and the second material may include SiGe.

In embodiments, a layer of a first material including a binary Group III-V material may be stacked alternately and repeatedly with a layer of a second material including a ternary Group III-V material.

In embodiments, the binary Group III-V material may be InP.

In embodiments, the ternary Group III-V material may be InGaAs or GaAsSb.

In embodiments, the first material and/or the second material may be doped with a dopant element.

In embodiments, the dopant element may be an n-type or a p-type dopant element.

BRIEF DESCRIPTION OF THE FIGURES

The figures are only schematic and are non-limiting. In the drawings, the size of some of the elements may be exaggerated and not drawn on scale for illustrative purposes. Any reference signs in the claims shall not be construed as limiting the scope. In the different drawings, the same reference signs refer to the same or analogous elements.

DETAILED DESCRIPTION

Figure 1:
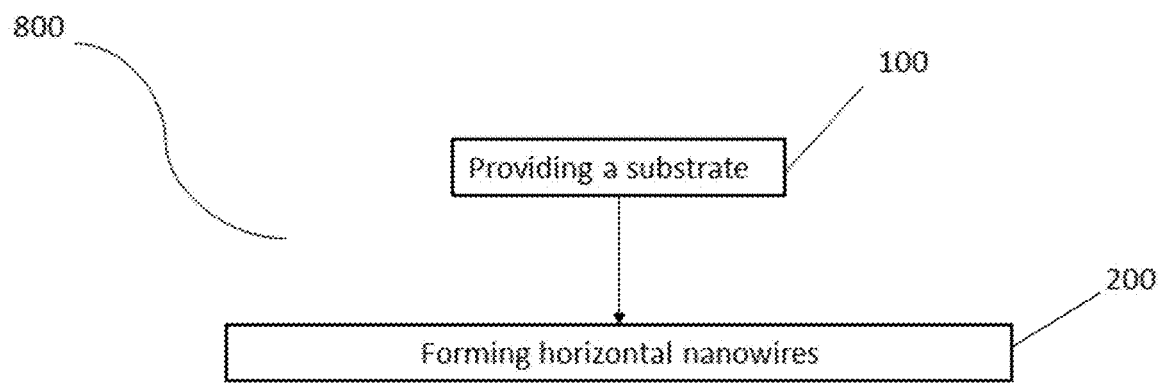
FIG. 1 is a flowchart representing a method, according to example embodiments of the present disclosure.

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the disclosure.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof.

Reference throughout the specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout the specification are not necessarily all referring to the same embodiment, but may do so. Furthermore, the particular features, structures or characteristics may be combined in any suitable manner, as would be apparent to one of ordinary skill in the art from the disclosure, in one or more embodiments.

Similarly, it should be appreciated that in the description of exemplary embodiments of the disclosure, various features of the disclosure are sometimes grouped together in a single embodiment, figure, or description thereof for the purpose of streamlining the disclosure and aiding in the understanding of one or more of the various aspects. The method of disclosure, however, is not to be interpreted as reflecting an intention that the claimed disclosure requires more features than are expressly recited in each claim. Rather, as the following claims reflect, some aspects lie in less than all features of a single foregoing disclosed embodiment. Thus, the claims following the detailed description are hereby expressly incorporated into the detailed description, with each claim standing on its own as a separate embodiment of the disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

In the description provided herein, numerous specific details are set forth. However, it is understood that embodiments of the disclosure may be practiced without these specific details. In other instances, well-known methods, structures and techniques have not been shown in detail in order not to obscure an understanding of the description.

The following terms are provided solely to aid in the understanding of the disclosure.

As used herein and unless provided otherwise, the term "sacrificial layer" refers to a layer that is meant to be sacrificed or removed at a certain stage in the process flow.

As used herein and unless provided otherwise, the term "suspended" refers to released and can be used interchangeably throughout the text.

As used herein and unless provided otherwise, the term "spin-on" refers to a class of dielectric materials that are deposited by spin-on coating technique.

As used herein and unless provided otherwise, the term "cladding layer" refers to a layer covering the complete exposed surface of the horizontal nanowire.

As used herein and unless provided otherwise, the term "exposed" refers to a layer, a surface or a region that is not protected from its surrounding environment.

As used herein and unless provided otherwise, the term "CD" refers to critical dimension and indicates the width of the feature in question.

As used herein and unless provided otherwise, the term "Self-Assembled Monolayer (SAM)" refers to molecular assemblies that form on the surfaces spontaneously by adsorption and are organized into more or less large ordered domains. SAM materials may possess a head group with a strong affinity to the substrate, a tail group and a functional end group. SAM materials are created by the chemisorption of the head groups onto the substrate from vapor or liquid phase followed by slow organization of the tail groups.

As used herein and unless provided otherwise, the term "room temperature" refers to temperature of 20° C.

As used herein and unless provided otherwise, the term "SiGe" refers to $Si_{1-x}Ge_x$, with x being a real number referring to the atomic percent.

The disclosure will now be described by a detailed description of several embodiments of the disclosure. It is clear that other embodiments of the disclosure can be configured according to the knowledge of persons skilled in the art without departing from the technical teaching of the disclosure, the disclosure being limited only by the terms of the appended claims.

Figure 3:
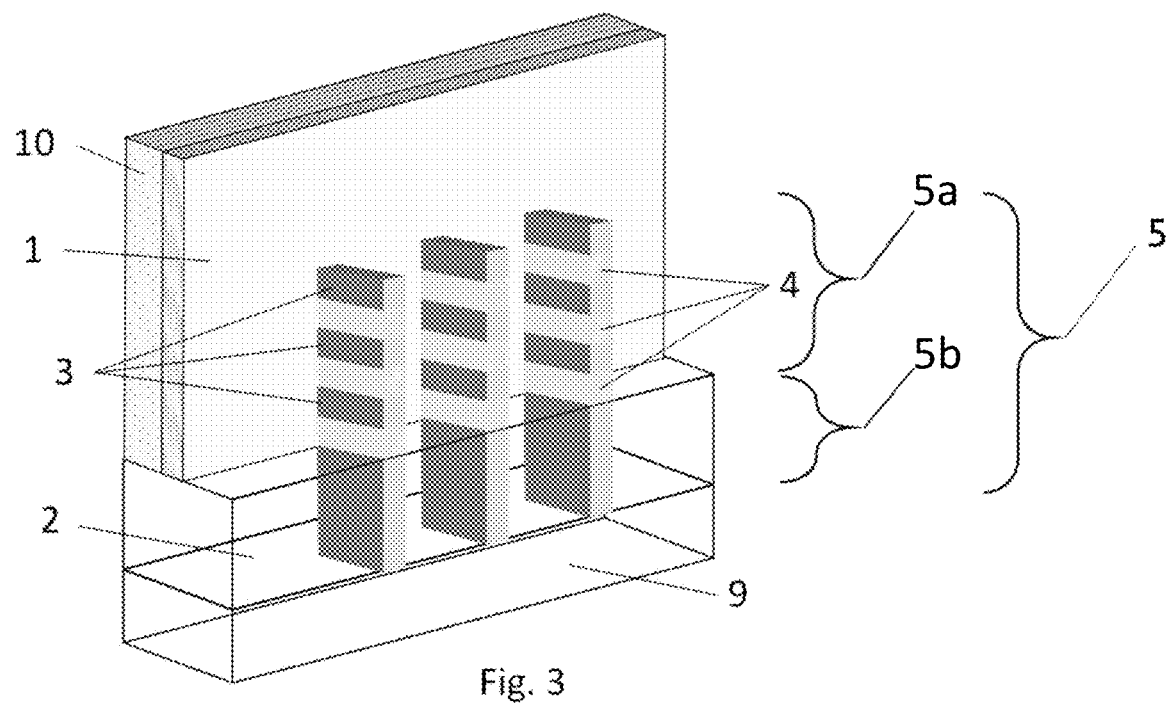
FIG. 3 shows schematically a substrate used for the forming of horizontal nanowires, according to example embodiments of the present disclosure.
Figure 4A:
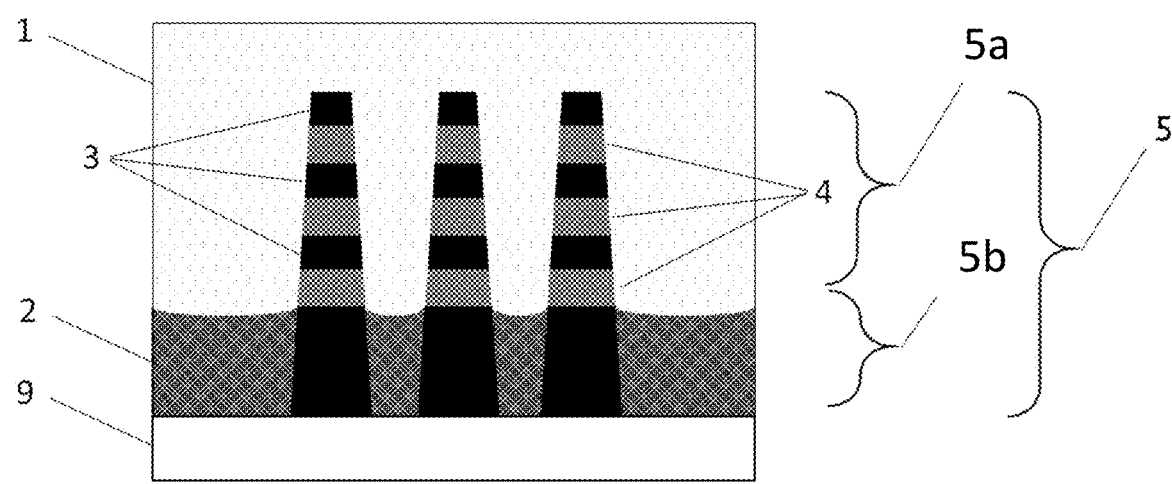
FIGS. 4A, 4B, 4C, 4D, 4E, 4F, 4Q 4H, 4I, 4J, 4K, and 4L schematically illustrate a process flow for forming horizontal nanowires, according to example embodiments of the present disclosure.

We now refer to FIG. 1, FIG. 3 and FIG. 4A.

FIG. 1 shows a flowchart representing a method according to embodiments of the present disclosure.

FIG. 3 schematically illustrates a substrate 9, tilted and in three dimensions (3D), used for the forming of horizontal nanowires according to embodiments of the present disclosure, and FIG. 4A schematically shows a cross section of this substrate 9. The multi-layer stack included in the substrate shown in these figures includes three layers 4 of a first material stacked alternately and repeatedly with three layers 3 of a second material. The figures should not be construed in any limiting sense such that the multi-layer stack included in the substrate may include more than two layers of first material stacked alternately and repeatedly with more than two layers of second material. In this way, a plurality of horizontal nanowires, greater than two, can be obtained.

The method 800 involves a step 100 of providing a substrate (e.g., substrate 9) and a step 200 of forming horizontal nanowires.

As illustrated in FIG. 3 and FIG. 4A, the substrate 9 includes a dielectric layer 2 and a fin structure 5. In embodiments, the substrate may be a silicon substrate. The substrate 9 may also be a silicon on insulator (SOI) substrate or any substrate suitable for growing fin structures. The dielectric layer 2 may be a silicon oxide layer. The dielectric layer 2 may be referred to as shallow trench isolation (STI) dielectric and may be in direct contact with the substrate 9. The fin structure 5 includes a portion 5a that protrudes from the dielectric layer 2 and a non-protruding portion 5b that is embedded in the dielectric layer 2. The bottom of the non-protruding portion 5b may lie at the interface between the dielectric layer 2 and the substrate 9. It may also lie above or below this interface. The bottom of the non-protruding portion 5b may be flat or may have V-shape. The protruding portion 5a is partially un-masked and includes a multi-layer stack. This multi-layer stack includes a layer 4 of a first material stacked alternately and repeatedly with the layer 3 of a second material.

In embodiments, the first material and/or the second material may be doped with a dopant element. This dopant element may be an n-type or a p-type dopant element. Typically, boron is used as a p-type dopant, while phosphorus or arsenic is used an n-type dopant.

In embodiments, the first material may include Si and Ge and the second material may include Si. In these embodiments, the first material may, for example, include SiGe and the second material may for example, include Si.

In other embodiments, the first material may include Si and Ge and the second material may include Ge. In these embodiments, the first material may, for example, be SiGe and the second material may for example, be Ge.

Alternatively, in other embodiments, the first material may include Si and the second material may include Si and Ge. In these alternative embodiments, the first material may, for example, include Si and the second material may, for example, include SiGe.

The fin structure 5 may be obtained after performing several processing steps. It can, for example, be obtained by providing a substrate 9 and depositing alternating and repeated layers of the first material and the second material. Further, a fin patterning process may be done in order to form the fin structure 5. Depending on the fin patterning process, a plurality of fin structures may be formed. Providing the dielectric layer 2 may embed the fin structure 5 in this dielectric layer 2. Performing an etch back process of the dielectric layer 2 may lead to the formation of the fin structure 5 including a portion protruding from the etch-backed dielectric layer 2, where the protruding portion includes the multi-layer stack. In some examples, the protruding portion 5a of the fin structure 5 may be covered conformally by a dielectric layer (not shown in the figures). When such a dielectric layer is present, this is typically referred to as a dummy dielectric layer and it can be removed from the unmasked protruding portion before performing the step 200 of forming the nanowires.

Partial masking of the protruding portion 5a is provided by a dielectric layer. This partial masking refers to masking a part of the protruding portion 5a including the top and the sidewalls of the protruding portion. This partial masking, thus, creates a partially un-masked portion. In embodiments, this dielectric layer may include a first dielectric layer 10 and a second dielectric layer 1 stacked horizontally and in contact with each other.

In embodiments, the first dielectric layer 10 may be a silicon oxide layer while the second dielectric layer 1 may be a silicon nitride layer. The second dielectric layer 1 may be used as gate spacer.

The protruding portion 5a of the fin structure 5 may be covered conformally by a dielectric layer (not shown in the figures). In the fabrication of horizontal gate-all-around nanowire field effect transistors (GAA-FET), this is typically referred to as a dummy gate dielectric layer. A dummy gate dielectric layer and a dummy gate may be used when fabricating the GAA-FET through Replacement Metal Gate (RMG) approach and it can be removed from the unmasked protruding portion before performing the step 200 of forming the nanowires.

Figure 2A:
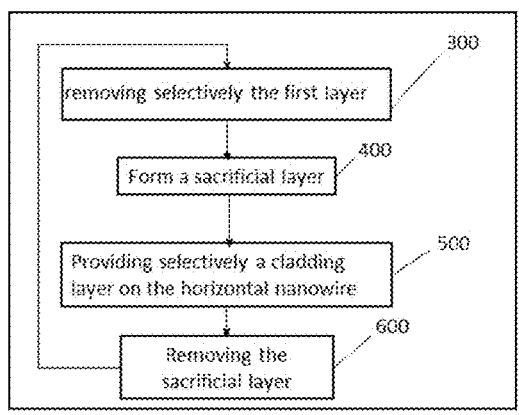
FIG. 2A is a flowchart representing formation of the horizontal nanowires according to an example embodiment of the present disclosure.

We now refer to FIG. 2A, showing a flowchart representing a method for the step 200 of forming the horizontal nanowires, while referring also to FIG. 4B to FIG. 4L showing corresponding cross-sections of the substrate at different stages of the method 200. Purely to facilitate understanding, different layers, even of the same material, are shown with different numbers, however, this should not be construed in any limiting sense.

Figure 4B:
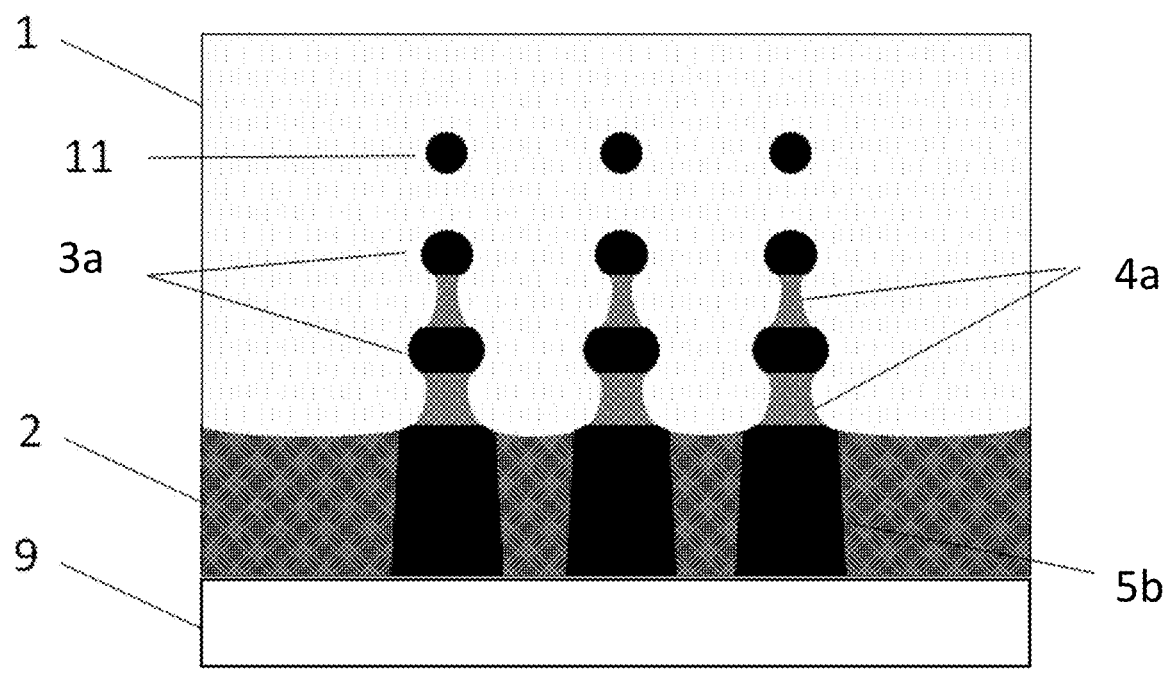
Figure 4C:
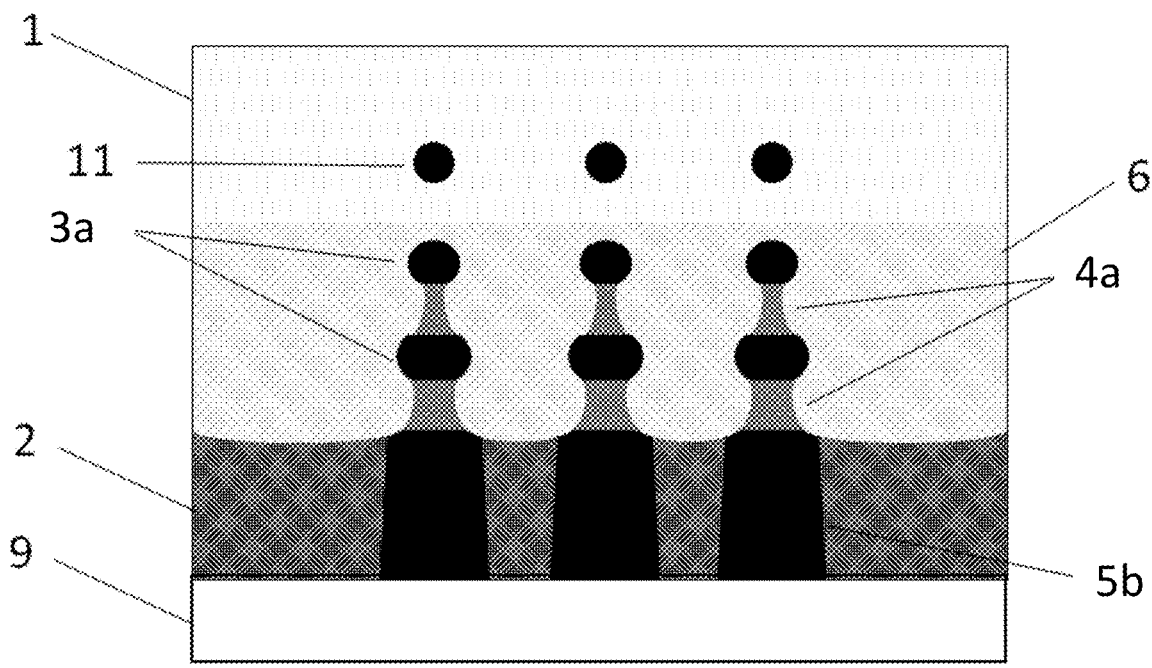

As illustrated in FIG. 2A, formation of the horizontal nanowires can be done by performing a cycle. This cycle includes a step 300 of removing selectively the first material. The first material is removed selectively up to the moment that a horizontal nanowire of the second material becomes suspended over a remaining portion of the partially un-masked protruding portion 5a. The horizontal nanowires become suspended starting from the top. Thus, as shown in FIG. 4B, the top nanowire 11 of the second material becomes suspended during the first cycle.

Figure 2B:
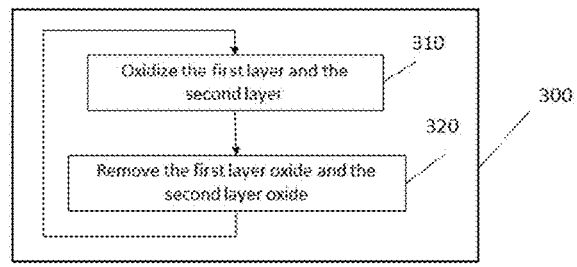
FIG. 2B is a flowchart representing selective removal of the first material, according to an example embodiment of the present disclosure.

In embodiments, as shown in FIG. 2B, selective removal of the first material may include a step 310 of oxidizing the first material and the second material. An etching process may be performed, whereby parameters of the etching process may be chosen to remove the oxide of the first material faster than the oxide of the second material, as indicated by step 320. This selective removal process including oxidation and etching may be cyclic repeated up to the moment that that a horizontal nanowire of the second material becomes suspended over a remaining portion of the partially un-masked protruding portion.

In embodiments, this etching process may be a dry plasma etching process.

This dry plasma etching process is advantageous since the first material and the second material can both be oxidized during the oxidation process. The rate of oxidation or the thickness of the oxide of the first material and the second material may depend on the oxidation kinetics of the first and the second material. This dry plasma etching process, thus, allows for formation of the horizontal nanowire with a desired diameter or, in other words, with a desired CD, by allowing for the removal of the oxide of the first material faster than the oxide of the second material. Furthermore, in the making of CMOS devices, one of the devices, either p-MOS or n-MOS can be protected by a photoresist layer during processing to make the n-MOS or the p-MOS. Thus, dry plasma etching is further advantageous since the photoresist layer is compatible with dry etching process.

The oxidation and the etching process done during the selective removal may also result in material loss of the other layers of the first material of the multi-layer stack shown in FIG. 4B, thus allowing them to end up with a non-uniform size 4a compared to their initial size 4 (shown in FIG. 4A). In the meantime, the other layers of the second material also end up with a non-uniform size 3a compared to their initial size 3 (shown in FIG. 4B).

In alternative embodiments, the first material may include a binary Group III-V material and the second material may comprise a ternary Group III-V material.

In these alternative embodiments, the selective removal may involve performing a wet etching process. The wet etching process may remove the binary Group III-V material, which is the first material.

In these alternative embodiments, the wet etching process may be done by using a wet etchant comprising hydrogen chloride.

In these alternative embodiments, the wet etchant may include water and hydrogen chloride. This wet etchant is advantageous since it allows for etching the binary Group III-nitride material selective towards the ternary Group III-nitride material.

In these alternative embodiments, the binary Group III-V material may be InP.

In these alternative embodiments, the ternary Group III-V material may be InGaAs or GaAsSb. Thus, this wet etchant will allow advantageously to etch InP selective towards InGaAs or GaAsSb.

In these alternative embodiments, this first material and/or this second material may be doped with a dopant element.

In these alternative embodiments, the dopant element may be an n-type or a p-type dopant element.

In these alternative embodiments, when the fin structure 5 has a tapered profile, the provision of the cladding layer 7 can protect the already formed suspended horizontal nanowire, while the size of the following suspended nanowire is being tuned according to the size of this already formed suspended nanowire. This is due to the fact that the use of the wet etchant can allow removal of the layer of the first material, which may be InP, selective to the layer of the second material, which may be InGaAs or GaAsSb, thereby forming the following horizontal nanowire. However, for tuning its size, this horizontal nanowire can be etched. This may be done by performing a dry plasma etching process, whereby protection of the horizontal nanowire already formed becomes necessary during the dry plasma etching process.

The method of the step 200 can also involve the step 400 of forming a sacrificial layer 6 on the partially un-masked protruding portion (shown in FIG. 4C) except for the suspended horizontal nanowire 11. This sacrificial layer 6 leaves the suspended horizontal nanowire uncovered. Thus, when this sacrificial layer is formed after the formation of the top horizontal nanowire 11 during the first cycle of the formation of the horizontal nanowires, the first suspended horizontal nanowire, which is the top one, is left uncovered.

In embodiments, the substrate 9 may be rotated along an axis perpendicular to a main surface of the substrate 9 during the formation of the sacrificial layer. Rotation allows for homogeneous distribution of the sacrificial layer 6 over the surface and allows for control of its thickness by adjusting the rotation speed. Adjustment of the thickness of the sacrificial layer 6 allows the suspended horizontal nanowire to remain un-covered, while allowing the remaining portion uniformly covered. Furthermore, it allows for providing freedom on the thickness for the provision of the cladding layer 7 on the suspended horizontal nanowire.

In embodiments, the sacrificial layer may be a spin-on material and may be self-planarizing.

Due to the fact that the sacrificial layer is formed after the horizontal nanowire becomes suspended, a further modification of the size of the suspended nanowire is undesired. A self-planarizing spin-on material has the advantage that it avoids creation of topography, while covering the remaining portion of the partially un-masked protruding portion. Absence of topography has the advantage that material removal processes become obsolete, thus avoiding the suspended nanowire becoming subjected to etch-back process to remove topography, which would otherwise jeopardize the diameter of the suspended horizontal nanowire.

In embodiments, the sacrificial layer may be formed as a spin-on-carbon layer. SOC is a self-planarizing layer and is able to cover the remaining portion without topography issues. SOC layer is easy to remove from the substrate, thus, does not pose a challenge on the distortion of the profile of the partial masking dielectric layer. This dielectric layer may include a first dielectric layer 10 and a second dielectric layer 1 stacked horizontally and in contact with each other. This partial masking dielectric layer may be used in the fabrication of horizontal gate-all-around nanowire field effect (GAA-FET) transistors and damaging may result in exposure of the gate electrode leading to electrical shorting of the gate electrode with the source or the drain region after establishing the electrical contact.

Figure 4D:
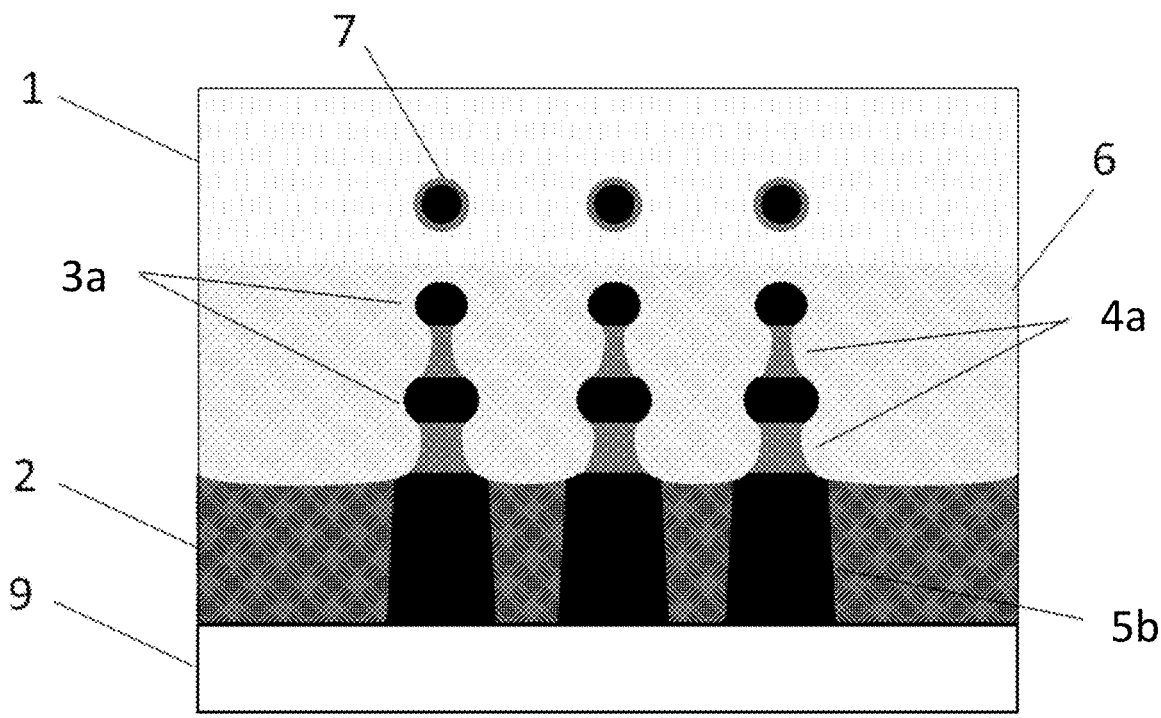

The method of the step 200 further includes a step 500 of providing a cladding layer 7 on the suspended horizontal nanowire 11 (shown in FIG. 4D). The cladding layer 7 covers the complete surface of the suspended horizontal nanowire 11.

The purpose of the cladding layer 7 is to protect the already formed suspended horizontal nanowire 11 during the selective removal of the first material that will be take place in a subsequent cycle to be performed for the formation of the subsequent horizontal nanowire. Therefore, the provision of a cladding layer 7 can help maintain the size of the suspended horizontal nanowire during the formation of the subsequent horizontal nanowires.

Furthermore, the provision of the cladding layer can provide an opportunity for increasing the number of cycles in the cyclic selective removal 300 (FIG. 2B) of the first material for the formation of subsequent horizontal nanowires, by protecting the already formed suspended horizontal nanowire. Considering the fact that the profile of the fin structure 5 may be tapered such that the width gets larger moving from its top to its bottom necessitates an extended number of cycles in the cyclic selective removal in order to achieve the size of horizontal nanowire that is protected by the cladding layer.

In embodiments, the cladding layer may be a metal.

In embodiments, the cladding layer may be Ni, Co or Ru.

In preferred embodiments, the cladding layer may be Ni. Use of Ni is advantageous since it protects the already formed horizontal nanowire towards the selective removal of the first material during the formation of the subsequent nanowires through selective removal.

In alternative embodiments, the cladding layer 7 may be a metal oxide. This metal oxide may be a high-k dielectric material. This high-k dielectric material may be aluminum oxide, hafnium oxide, zinc oxide, zirconium oxide or titanium oxide. Using a metal oxide cladding layer is advantageous due to the fact that it is not affected by cyclic selective removal process that is carried out for the formation of the horizontal nanowire.

In embodiments, selective provision of the cladding layer 7 may be done by electro-less deposition or by an Atomic Layer Deposition (ALD) process. Electro-less deposition or ALD process is advantageous since conformal, uniform cladding layer may be deposited with controlled thickness. In embodiments, the provision of the cladding layer 7 may further include first removal of the native oxide from the surface of the layer 4 of the first material and the layer 3 of the second material. This native oxide removal may be achieved by a treatment using diluted hydrogen fluoride (HF). Removal of the native oxide by diluted HF treatment makes the surface of the nanowires become H-terminated.

In embodiments where the suspended horizontal nanowires are doped with a dopant element, provision of the cladding layer 7 by electro-less deposition may be advantageous. In these embodiments, removal of the native oxide from the surface of the layer 4 of the first material and the layer 3 of the second material is advantageous for the efficiency of the electro-less deposition of the cladding layer Removal of the native oxide may be done by performing a diluted HF treatment. Using electro-less deposition for the provision of the cladding layer 7 is advantageous when the layer of the second material is Si-comprising. Thus, when the suspended horizontal nanowires are made of doped Si, for example, it will be advantageous to use electro-less deposition for the provision of the cladding layer 7. In these embodiments, the cladding layer 7 may be nickel, cobalt or ruthenium. In embodiments, provision of the cladding layer 7 may include application of a self-assembled monolayer (SAM) (not shown in the figures). The self-assembled monolayer may be applied as an inhibition layer on the exposed surfaces of the first dielectric layer 10 and the second dielectric layer 1, but not on the exposed sacrificial layer 6, thereby facilitating easy and direct provision of the cladding layer on the suspended horizontal nanowire. When SAM is used as the inhibition layer, the choice of SOC as the sacrificial layer 6 provides a further advantage such that it is immune to the SAM layer, and thus, the SAM layer will not be deposited on the SOC sacrificial layer 6.

When the SAM layer is used as an inhibition layer, provision of the cladding layer 7 may be done by electro-less deposition or ALD process. In embodiments, where the layer of the second material is Si-comprising, using electro-less deposition is advantageous. Thus, when the suspended horizontal nanowires are made of doped Si, for example, electro-less deposition can be used for the provision of the cladding layer 7 including the application of a self-assembled monolayer (SAM). In these embodiments, the cladding layer 7 may be nickel, cobalt or ruthenium.

In embodiments, when ALD process is used for the provision of the metal cladding layer 7 comprising the application of the SAM layer, the cladding layer 7 may be nickel, cobalt or ruthenium and the second material may comprise Si or may comprise ternary Group III-V material.

Alternatively, in these embodiments, where ALD is process is used, the cladding layer 7 may also be a metal oxide, which may be aluminum oxide, hafnium oxide, zinc oxide, zirconium oxide or titanium oxide. The metal oxide may be directly provided as metal oxide by the ALD process. Alternatively, metal of the metal oxide may be provided by the ALD process, which then may be followed by oxidation of this metal to thereby obtain the metal oxide cladding layer 7.

In embodiments, where the suspended horizontal nanowires are not doped with a dopant element, provision of the cladding layer 7 may still be done by electro-less deposition. This may be achieved by the use of a second SAM layer that may be provided on the on the H-terminated nanowires thanks to the removal of the native oxide by the diluted HF treatment. Provision of the second SAM layer can make it possible for the cladding layer to be deposited on the nanowires.

In these embodiments, the layer of the second material may include Si. Thus, the suspended horizontal nanowires may be made of doped Si.

Figure 4E:
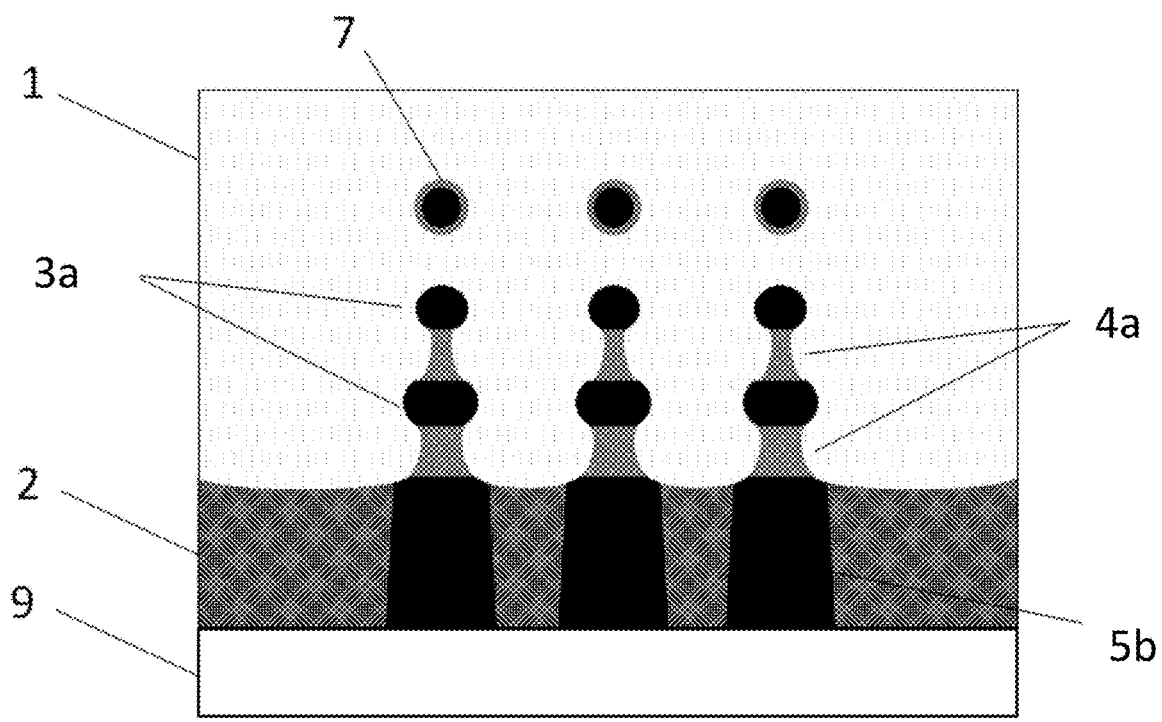
Figure 4F:
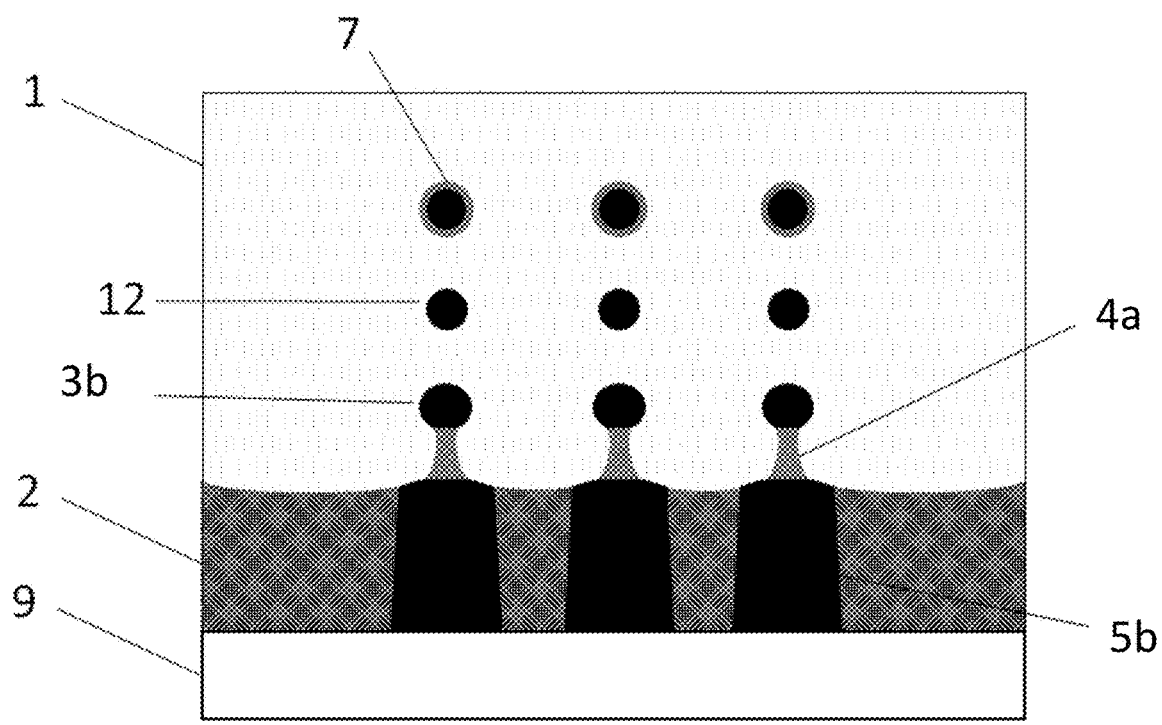
Figure 4G:
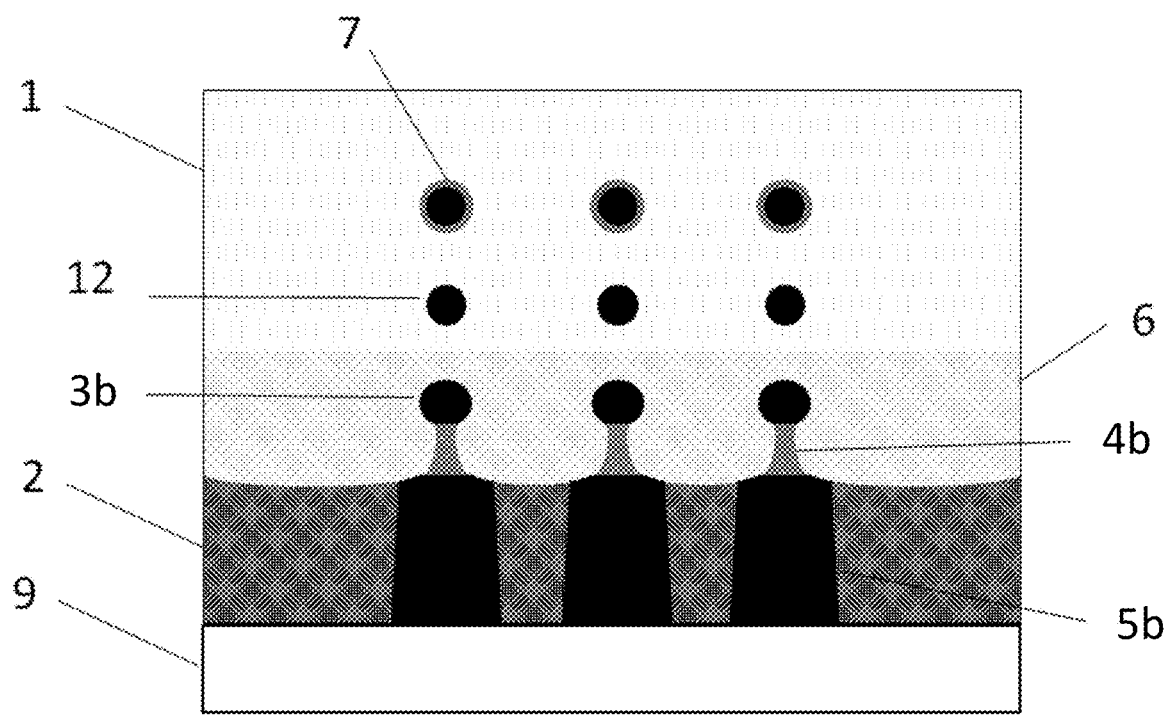
Figure 4H:
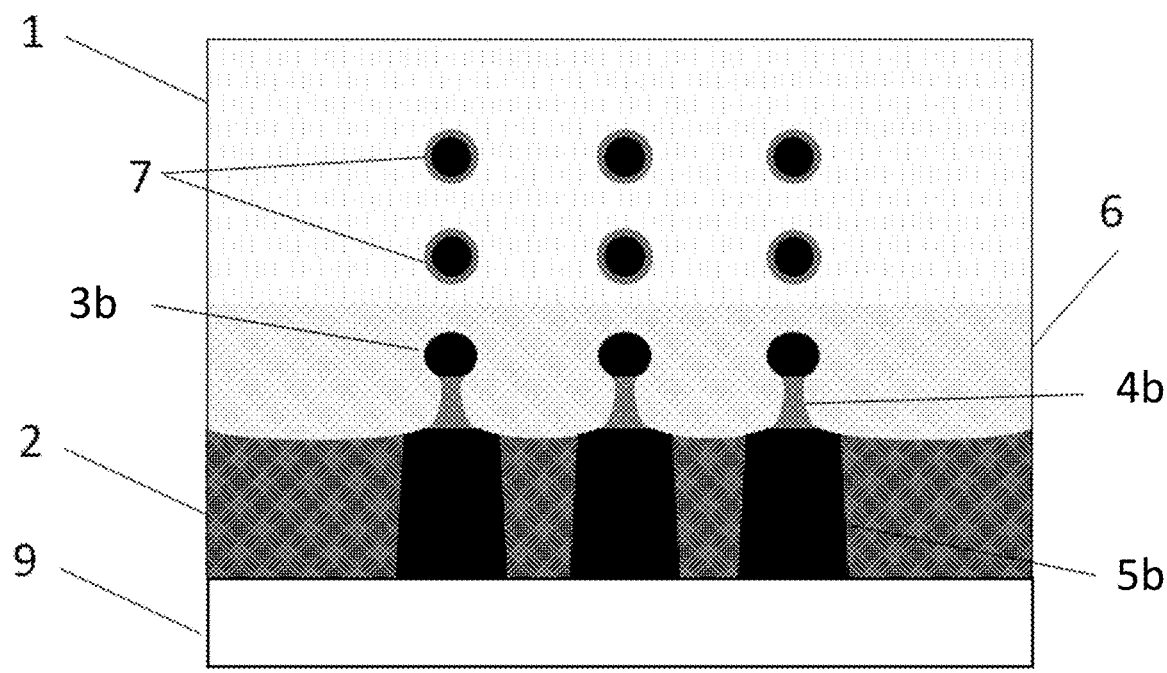
Figure 4I:
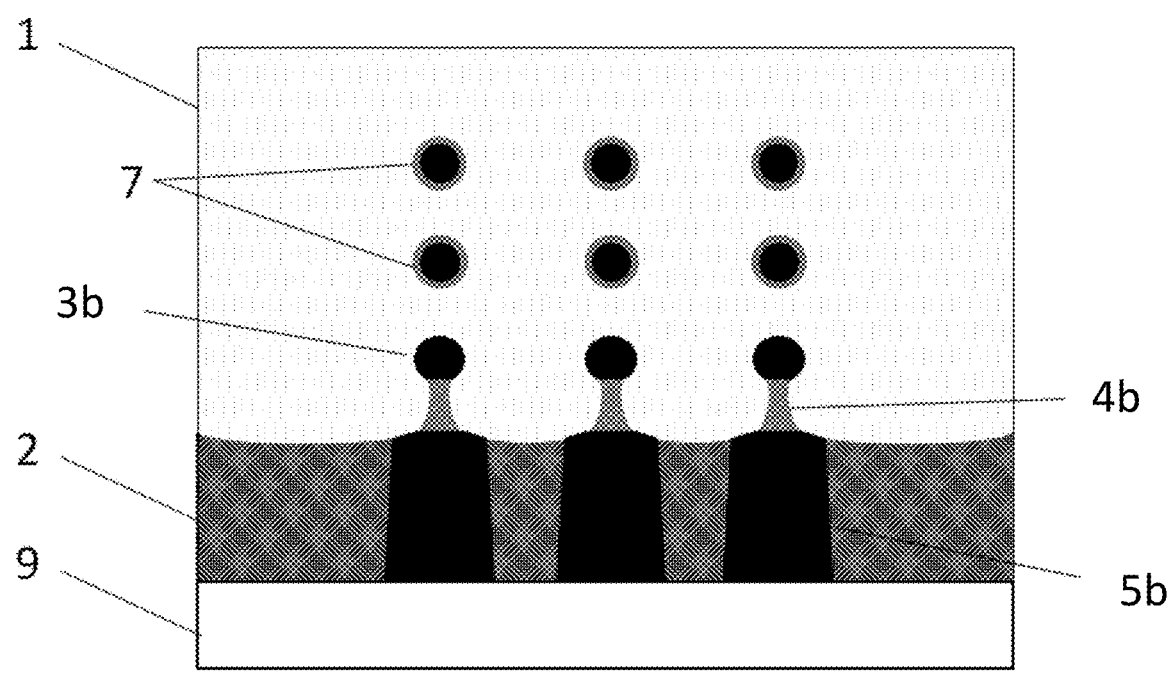
Figure 4J:
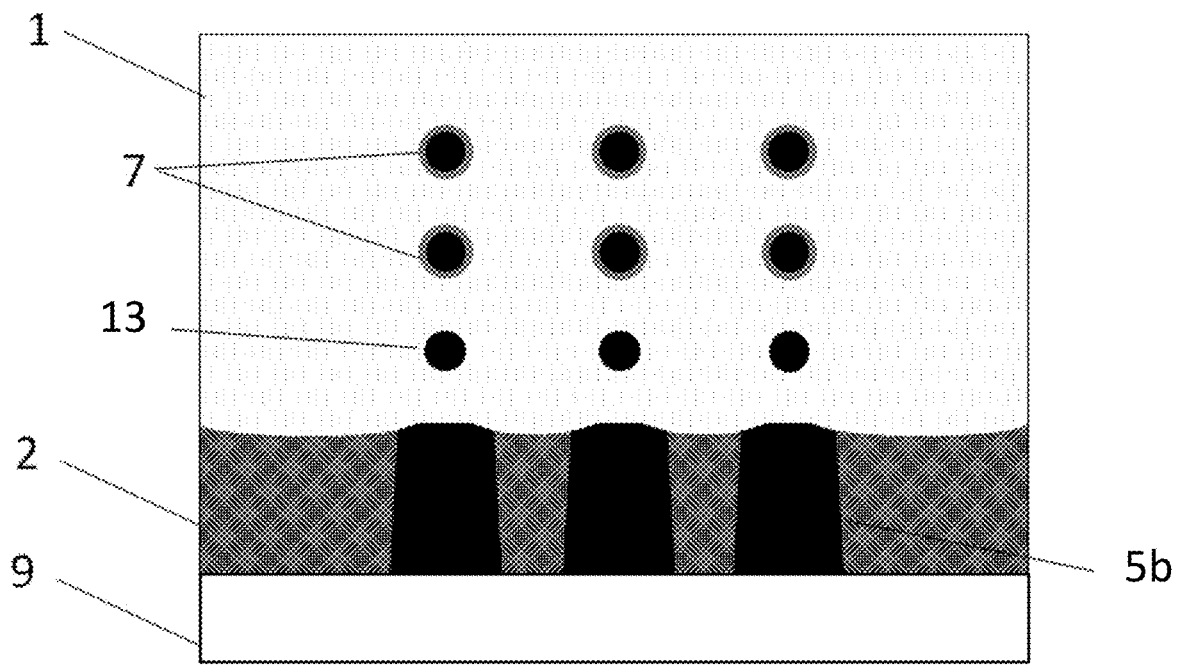

Before the selective removal of the first material starts in the subsequent cycle for forming the subsequent horizontal nanowire, the method of the step 200 can further involve a step 600 of removing the sacrificial layer 6 from the remaining portion (as shown in FIG. 4E). Removal of the sacrificial layer may be done by performing a dry plasma etching process using an oxygen plasma. This oxygen plasma does not damage the exposed surfaces of the substrate 9. Furthermore, since the already suspended horizontal nanowire 11 is covered by the cladding layer 7, it is also protected and thus, its size is maintained. Removal of the sacrificial layer 6 thus, completes the first cycle of the formation of horizontal nanowires, whereby the top nanowire is formed as shown in FIG. 4E.

Figure 4K:
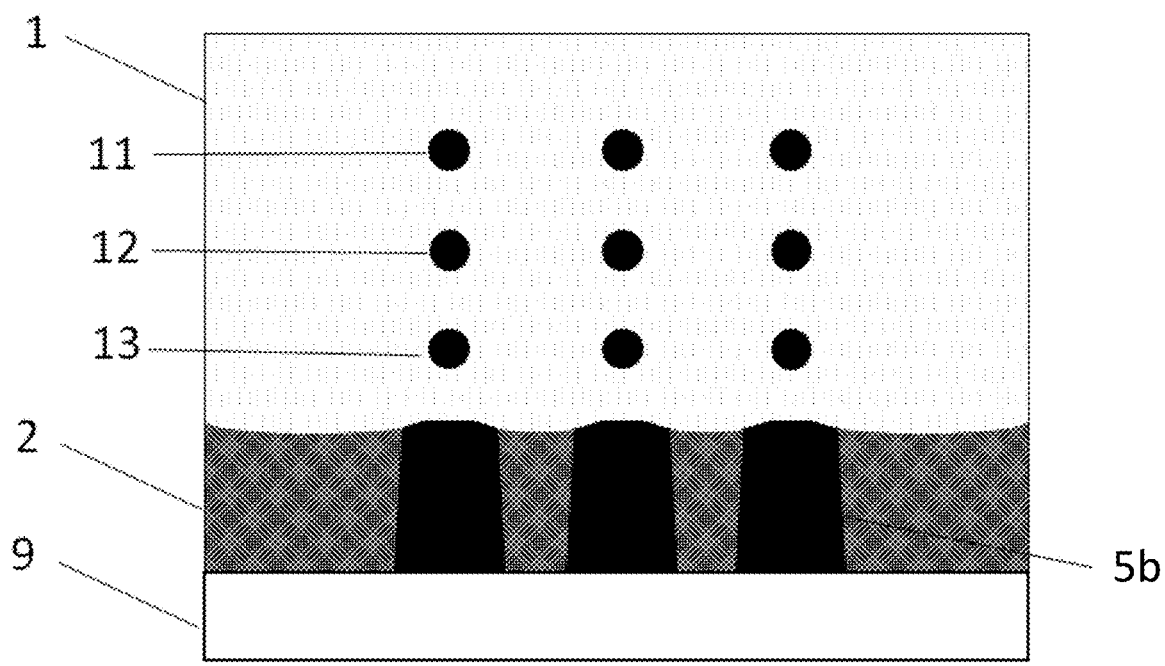

FIG. 4F, FIG. 4Q FIG. 4H, and FIG. 4I schematically show how another cycle is completed to form the subsequent horizontal nanowire, where this subsequent nanowire is also covered selectively with the cladding layer 7 at the end of this another cycle. Applying a final cyclic selective removal of the first material from the remaining portion of the partially un-masked protruding portion can lead to the formation of the bottom horizontal nanowire. This final cyclic selective removal can also tune the size of the bottom horizontal nanowire in line with the size of the previously formed nanowires. After the formation of this bottom horizontal nanowire (shown in FIG. 4J), the cladding layer 7 covering the previously formed horizontal nanowires is removed (as shown in FIG. 4K). Horizontal nanowires are formed with substantially the same diameter. Having substantially the same diameter or size may refer to the fact that the diameter of the horizontal nanowires may have a standard deviation of 2 nm.

The (desired) diameter of the horizontal nanowires can be determined as a function of the technology node in CMOS manufacturing. The control of the diameter of the horizontal nanowires can be achieved by the cyclic selective removal process. Its verification may be done by performing a cross section scanning electron microscopy (X-SEM) or transmission electron microscopy (TEM).

Removal of the cladding layer 7 may be done by performing a wet etching process. This wet etching process may be done by using HCl.

The masked portion of the protruding portion 5a of the fin structure 5 is protected against the selective removal during the formation of suspended horizontal nanowires 11, 12, and 13. Thus, even after the formation of the suspended horizontal nanowires 11, 12, and 13, the layer of the first material and the layer of the second material of the multi-layer stack is present as being stacked alternately and repeatedly with each other.

Figure 4L:
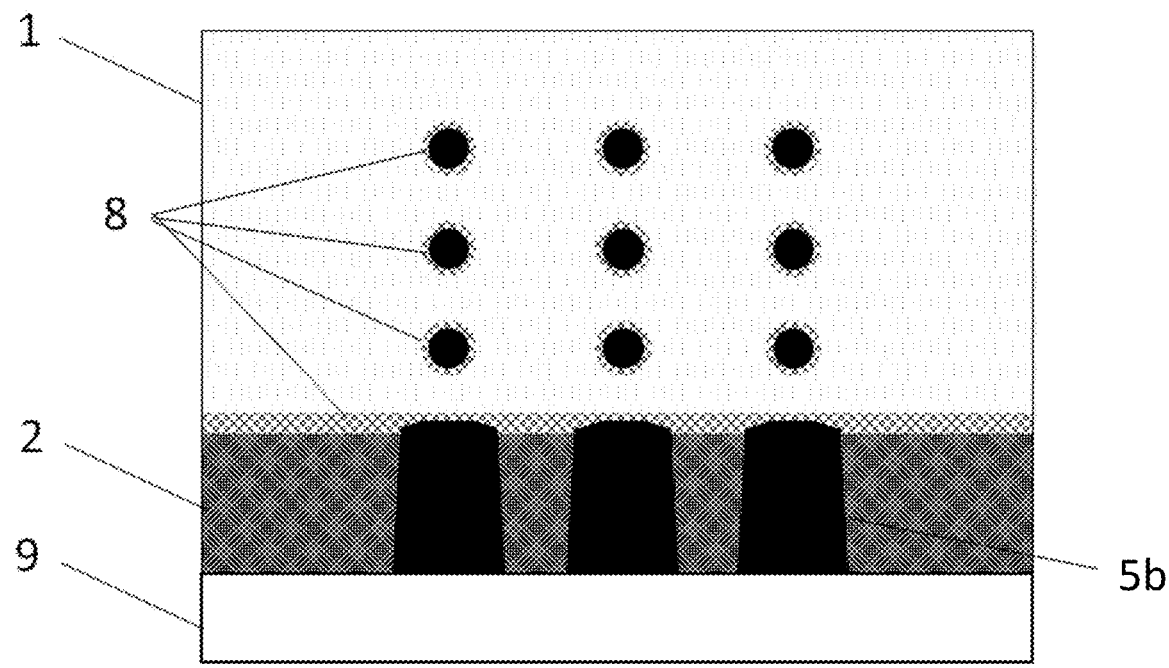
Figure 5:
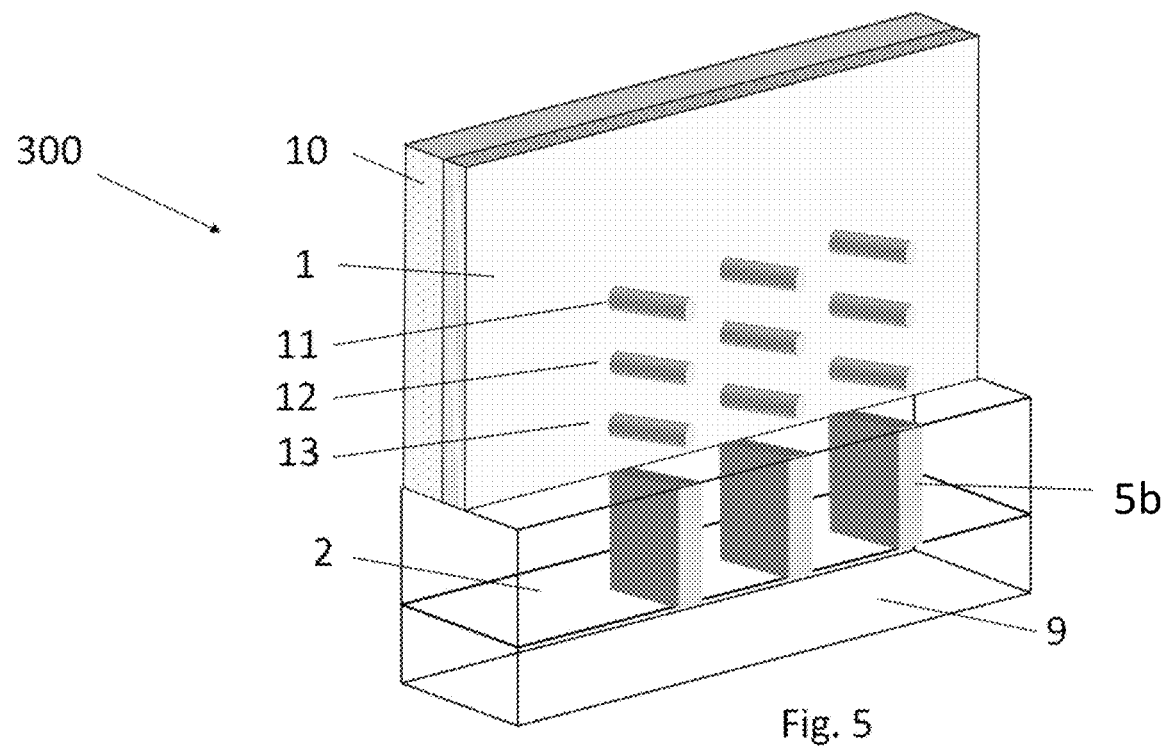
FIG. 5 schematically illustrates a semiconductor structure including horizontal nanowires formed, according to example embodiments of the present disclosure.

In embodiments, the present disclosure relates to a method for fabricating a horizontal gate-all-around nanowire field effect transistor (GAA-FET). The method may involve forming suspended horizontal nanowires 11, 12, 13 according to embodiments of the first aspect of the present disclosure (as shown in FIG. 4K and FIG. 5). A gate stack 8 may be provided that surrounds the suspended horizontal nanowires 11, 12, and 13, as shown in FIG. 4L. This gate stack may include a gate insulator and a gate metal provided on the gate insulator. This gate insulator may be a high-k dielectric layer. This gate metal may be a gate metal stack including layers dedicated for effective work function tuning.

In these embodiments, when the first material includes Si and Ge and the second material includes Si, the fabricated horizontal GAA nanowire FET will be a n-MOS device. This is due to the fact that selective removal of the first material will result in the formation of horizontal nanowires including Si. In embodiments, the first material may be $Si_{(1-x)}Ge_x$ and the second material may be Si. In these embodiments, the atomic % (x) of Ge in $Si_{(1-x)}Ge_x$ may be 25%, 50% or 75%. Therefore, in embodiments, the first material may be $Si_{(1-x)}Ge_x$ having 25 atomic % Ge and the second material may be Si. $Si_{(1-x)}Ge_x$ having 25 atomic % Ge is better suited for epitaxial growth on Si.

In alternative embodiments, the first material may be $Si_{(1-x)}Ge_x$ having 75 atomic % Ge. In these alternative embodiments, the second material may be Ge. SiGe having 75 atomic % Ge is better suited for epitaxial growth on Ge.

On the other hand, when the first material includes Si and the second material includes Si and Ge, the fabricated horizontal GAA nanowire FET will be an p-MOS device. This is due to the fact that selective removal of the first material will result in the formation of horizontal nanowires including Si and Ge.

Similarly, when the multi-layer stack of the layer of first material including the binary Group III-V material stacked alternately and repeatedly with the layer of the second material comprising a ternary Group III-V material is used, the fabricated horizontal GAA nanowire FET will be a p-MOS device or an n-MOS device after removal of the binary Group III-V material, which may be InP. When the layer of the second material includes InGaAs, the resulting horizontal GAA nanowire FET will be an n-MOS device, while it will be a p-MOS device if the second material includes GaAsSb.

Figure 6:
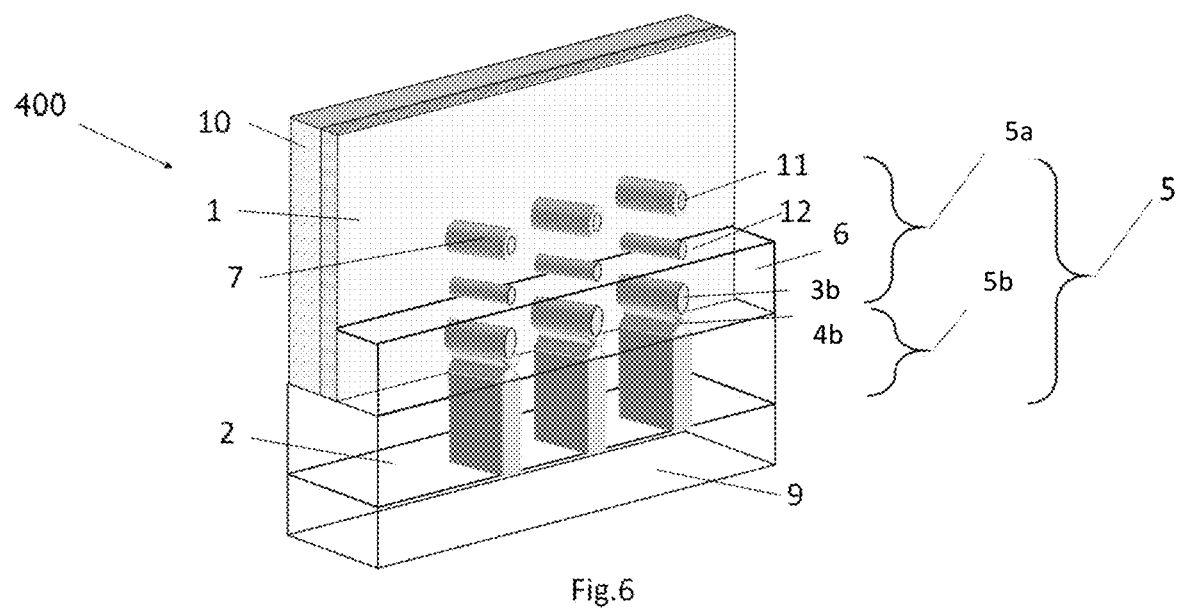
FIG. 6 schematically illustrates a semiconductor structure obtained during the formation of horizontal nanowires, according to example embodiments of the present disclosure.

We now refer to FIG. 6 that shows schematically a semiconductor structure 400, according to a second aspect of the present disclosure.

The semiconductor structure 400 includes a substrate 9 including a dielectric layer 2 and a fin structure 5. The fin structure 5 includes a portion 5a protruding from the dielectric layer 2. The protruding portion is partially un-masked thereby comprising a multi-layer stack. The multi-layer stack includes a layer 4 of a first material stacked alternately and repeatedly with a layer 3 of a second material. The partially un-masked protruding portion further includes horizontal nanowires 11, 12 of the second material suspended over a sacrificial layer 6 and at least one of the horizontal nanowires 11 is covered with a cladding layer 7. The sacrificial layer 6 covers the multi-layer stack, whereby layers 4b of the first material stacked alternately and repeatedly with layers of the second material 3b. The layers 3b and 4b have a non-uniform size. By non-uniform size it is meant that the size of the layers 3b and 4b are not in agreement with each other. The partially masked portion of the protruding portion 5a has the multi-layer stack, whereby the alternating layers 3 and 4 have uniform size.

In embodiments, the sacrificial layer 6 may be a spin-on-carbon layer.

This semiconductor structure is advantageous due to the fact that it allows sequential formation of plurality of horizontal nanowires. It is, therefore, further advantageous for the manufacturing of horizontal gate-all-around nanowire field effect transistors (GAA-FET).

In embodiments, the bottom of the non-protruding portion 5b may lie at the interface between the dielectric layer 2 and the substrate 9. It may also lie above or below this interface. The bottom of the non-protruding portion (5b may be flat or may have V-shape.

Partial masking of the protruding portion 5a is provided by a dielectric layer. This partial masking refers to masking a part of the protruding portion 5a including the top and the sidewalls. This partial masking, thus, can create a partially un-masked portion. In embodiments, this dielectric layer may include a first dielectric layer 10 and a second dielectric layer 1 stacked horizontally and in contact with each other.

In embodiments, the first dielectric layer 10 may be a silicon oxide layer while the second dielectric layer 1 may be a silicon nitride layer.

In embodiments, diameter of the horizontal nanowires 11 and 12 may be substantially the same.

Thus, the semiconductor structure allows sequential formation of plurality of horizontal nanowires having substantially the same diameter. It is, therefore, advantageous for the manufacturing of horizontal gate-all-around nanowire field effect transistors (GAA-FET) with improved device performance thanks to the plurality of horizontal nanowires having substantially the same diameter. In horizontal gate-all-around nanowire field effect transistors (GAA-FET), current is transferred through each of these nanowires. Having substantially the same diameter, thus, allows for reducing distortions in current flow, thereby improving device performance.

In embodiments, the cladding layer 7 may be a metal.

The presence of the cladding layer 7 is an indication that the horizontal nanowire has the desired diameter and thus, its presence can maintain the size of the horizontal nanowire.

In embodiments, this metal may be Ni, Co or Ru.

In other embodiments, this metal is Ni.

In alternative embodiments, the cladding layer 7 may be a metal oxide. This metal oxide may be a high-k dielectric material. This high-k dielectric material may be aluminum oxide, hafnium oxide, zinc oxide, zirconium oxide or titanium oxide.

In embodiments, the first material may include Si and Ge and the second material may include Si. In these embodiments, the first material may include SiGe, while the second material may include Si.

In embodiments, the first material may be $Si_{(1-x)}Ge_x$ and the second material may be Si. In these embodiments, the atomic % (x) of Ge in $Si_{(1-x)}Ge_x$ may be 25%, 50% or 75%. Therefore, in embodiments, the first material may be $Si_{(1-x)}Ge_x$ having 25 atomic % Ge and the second material may be Si.

In embodiments, the first material may include Si and Ge and the second material may include Ge. In these embodiments, the first material may, for example, be SiGe and the second material may for example, be Ge.

In embodiments, the first material may be $Si_{(1-x)}Ge_x$ having 75 atomic % Ge. In these embodiments, the second material may be Ge.

In alternative embodiments, the first material may include a binary Group III-V material and the second material may include a ternary Group III-V material.

In these alternative embodiments, the binary Group III-V material may be InP.

In these alternative embodiments, the ternary Group III-V material may be InGaAs or GaAsSb.

In embodiments, this first material and/or this second material may be doped with a dopant element.

In embodiments, the dopant element may be an n-type or a p-type dopant element.

What is claimed is:

1. A method for forming horizontal nanowires, the method comprising:
   providing a substrate comprising a dielectric layer and a fin structure, wherein the fin structure comprises a portion protruding from the dielectric layer, and wherein the protruding portion is partially un-masked and comprises a multi-layer stack that comprises a layer of a first material stacked alternately and repeatedly with a layer of a second material, wherein layers of a portion of the multilayer stack of the partially un-masked protruding portion have a non-uniform size; and
   forming horizontal nanowires, wherein the forming comprises performing a cycle comprising:
   selectively removing the first material such that a horizontal nanowire of the second material is suspended over a remaining portion of the partially un-masked protruding portion;
   forming a sacrificial layer on the remaining portion, while leaving the suspended horizontal nanowire uncovered;
   providing, selectively, a metal cladding layer on the suspended horizontal nanowire; and
   removing the sacrificial layer.

2. The method of claim 1, wherein the horizontal nanowires formed in the cycle become suspended starting from a top horizontal nanowire to a bottom horizontal nanowire.

3. The method of claim 2, further comprising:
   removing the cladding layer after the bottom horizontal nanowire becomes suspended.

4. The method of claim 1, wherein the substrate is rotated during the forming of the sacrificial layer.

5. The method of claim 1, wherein the sacrificial layer is a spin-on material and is self-planarizing.

6. The method of claim 1, wherein the sacrificial layer is formed as a spin-on-carbon layer.

7. The method of claim 1, wherein the selective removal of the first material is cyclic and comprises:
   oxidizing the first material and the second material; and
   performing an etching process, wherein parameters of the etching process are chosen to remove an oxide of the first material is faster than an oxide of the second material.

8. The method of claim 7, wherein the etching process is a dry plasma etching process.

9. The method of claim 1, wherein providing, selectively, the cladding layer comprises performing an electro-less deposition or an atomic layer deposition.

10. The method of claim 1, wherein the first material comprises Si and Ge, and the second material comprises Si.

11. The method of claim 1, wherein the first material comprises Si and the second material comprises Si and Ge.

12. The method of claim 1, further comprising:
    providing a gate stack, surrounding the suspended horizontal nanowires, wherein the gate stack comprises a gate insulator and a gate metal provided on the gate insulator.

13. A semiconductor structure comprising:
    a substrate comprising a dielectric layer; and
    a fin structure comprising a portion protruding from the dielectric layer, wherein the protruding portion is partially un-masked, and wherein the partially un-masked protruding portion comprises:
    a multilayer stack that includes a layer of a first material stacked alternately and repeatedly with a layer of a second material, and a horizontal nanowire of the second material that is covered with a metal cladding layer, wherein the horizontal nanowire is suspended over the multilayer stack and a sacrificial layer covering the multilayer stack, and wherein layers of a portion of the multilayer stack of the partially un-masked protruding portion have a non-uniform size.

14. The structure of claim 13, wherein the sacrificial layer is formed as a spin-on-carbon layer.

15. The structure of claim 13, wherein:
a diameter of the horizontal nanowires is substantially the same.

16. The structure of claim 13, wherein the first material comprises Si and Ge, and the second material comprises Si.

17. The structure of claim 13, wherein the first material comprises Si and the second material comprises Si and Ge.

18. The structure of claim 13, further comprising:
a gate stack, surrounding the suspended horizontal nanowires, wherein the gate stack comprises a gate insulator and a gate metal provided on the gate insulator.

19. A semiconductor structure comprising:
a substrate comprising a dielectric layer; and
a fin structure comprising a portion protruding from the dielectric layer, wherein the protruding portion comprises a multilayer stack that includes a layer of a first material stacked alternately and repeatedly with a layer of a second material, wherein the protruding portion is partially un-masked, and wherein the partially un-masked protruding portion comprises:
at least one horizontal nanowire of the second material suspended over a remaining portion of the multilayer stack that includes layers of the first material and second material, wherein the at least one horizontal nanowire is covered with a metal cladding layer, wherein a sacrificial layer covers the remaining portion of the multilayer stack and leaves the at least one horizontal nanowire uncovered, and wherein layers of a portion of the multilayer stack of the partially un-masked protruding portion have a non-uniform size.

20. The structure of claim 19, wherein the fin structure includes non-protruding portion embedded in the dielectric layer.

21. The structure of claim 19, wherein the protruding portion includes a partially masked portion, and wherein a top and sidewalls of the partially masked portion of the protruding portion are masked.

* * * * *